United States Patent
Shrivastava et al.

(10) Patent No.: US 12,223,241 B2
(45) Date of Patent: Feb. 11, 2025

(54) NOISE MODELING USING MACHINE LEARNING

(71) Applicant: GM Cruise Holdings LLC, San Francisco, CA (US)

(72) Inventors: Ashish Shrivastava, San Jose, CA (US); Surya Dwarakanath, San Francisco, CA (US); Ignacio Martin Bragado, Mountain View, CA (US); Amin Aghaei, Fremont, CA (US); Ambrish Tyagi, Sunnyvale, CA (US)

(73) Assignee: GM Cruise Holdings LLC, San Francisco, CA (US)

( * ) Notice: Subject to any disclaimer, the term of this patent is extended or adjusted under 35 U.S.C. 154(b) by 155 days.

(21) Appl. No.: 18/092,732

(22) Filed: Jan. 3, 2023

(65) Prior Publication Data

US 2024/0220681 A1    Jul. 4, 2024

(51) Int. Cl.
*G06F 30/27* (2020.01)
*G06T 17/00* (2006.01)

(52) U.S. Cl.
CPC .............. *G06F 30/27* (2020.01); *G06T 17/00* (2013.01); *G06T 2210/56* (2013.01)

(58) Field of Classification Search
None
See application file for complete search history.

(56) References Cited

U.S. PATENT DOCUMENTS

| | | | |
|---|---|---|---|
| 2018/0365888 A1* | 12/2018 | Satzoda | G05D 1/0251 |
| 2021/0366205 A1* | 11/2021 | Juppe | G06T 5/73 |
| 2022/0036185 A1* | 2/2022 | Dronen | G06N 3/065 |

OTHER PUBLICATIONS

Chai et al., "GAN Inversion Based Point Clouds Denoising in Foggy Scenarios for Autonomous Driving", Nov. 9-11, 2023, IEEE, 2023 IEEE International Conference on Development and Learning (ICDL), pp. 107-112 (Year: 2023).*

* cited by examiner

*Primary Examiner* — Sultana M Zalalee
*Assistant Examiner* — Jonathan M Cofino
(74) *Attorney, Agent, or Firm* — Dimitri Kirimis (57) ABSTRACT

Systems and techniques are described for Light Detection and Ranging (LiDAR) noise modeling using machine learning (ML). An example method can include collecting, using one or more sensors, a first set of data for a simulation environment and generating, using the first set of data, a point cloud that represents and/or describes the simulation environment. The method can further include collecting, using the one or more sensors, a second set of data for a real-world environment and generating a noise model using the second set of data and a neural network. The method can also include generating, using the noise model and the point cloud, a noisy point cloud that represents and/or describes the real-world environment.

20 Claims, 7 Drawing Sheets

NOISE MODELING USING MACHINE LEARNING

BACKGROUND

1. Technical Field

The present disclosure generally relates to systems and methods for noise modeling using machine learning (ML), and more specifically, to solutions for using machine learning to characterize real world noise in a simulation environment.

2. Introduction

Autonomous vehicles (AVs) are vehicles having computers and control systems that perform driving and navigation tasks that are conventionally performed by a human driver. As AV technologies continue to advance, they will be increasingly used to improve transportation efficiency and safety. As such, AVs will need to perform many of the functions that are conventionally performed by human drivers, such as performing navigation and routing tasks necessary to provide a safe and efficient transportation. Such tasks may require the collection and processing of large quantities of data using various sensor types, including but not limited to cameras and/or Light Detection and Ranging (LiDAR) sensors disposed on the AV.

BRIEF DESCRIPTION OF THE DRAWINGS

The various advantages and features of the present technology will become apparent by reference to specific implementations illustrated in the appended drawings. A person of ordinary skill in the art will understand that these drawings only show some examples of the present technology and would not limit the scope of the present technology to these examples. Furthermore, the skilled artisan will appreciate the principles of the present technology as described and explained with additional specificity and detail through the use of the accompanying drawings in which.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a more thorough understanding of the subject technology. However, it will be clear and apparent that the subject technology is not limited to the specific details set forth herein and may be practiced without these details. In some instances, structures and components are shown in block diagram form in order to avoid obscuring the concepts of the subject technology.

One aspect of the present technology is the gathering and use of data available from various sources to improve quality and experience. The present disclosure contemplates that in some instances, this gathered data may include personal information. The present disclosure contemplates that the entities involved with such personal information respect and value privacy policies and practices.

Autonomous vehicles (AVs), also known as self-driving cars, driverless vehicles, and robotic vehicles, are vehicles that use sensors to sense the environment and move without human input. Automation technology enables the AVs to drive on roadways and to perceive the surrounding environment accurately and quickly, including obstacles, signs, and traffic lights. In some cases, AVs can be used to pick up passengers and drive the passengers to selected destinations.

Autonomous vehicles may contain multiple sensor systems (which will be discussed in further detail in FIG. 1 below) including, but not limited to, Inertial Measurement Units (IMUs), still image and video cameras, light sensors (e.g., light detection and ranging (LiDAR) sensors, etc.), and radio detection and ranging (RADAR) systems. AV sensor systems can function in different environments that the AV may potentially encounter. For example, a LiDAR system emits light particles (e.g., photons) that hit nearby objects such as other cars, pedestrians, and objects. The photons then return or "bounce back" to the LiDAR sensor. The LiDAR system measures each photon's roundtrip data measuring distance and time to an object(s) in the AV's vicinity which results in a three-dimensional (3D) representation of the surrounding environment. In some examples, the LiDAR system may have a certain range (e.g., 250-400 meters or any other range), which enables the AV to identify objects within that range and their respective positions. The sensor system is an important element in the function of the AV, enabling the vehicle to sense the surrounding environment without human intervention.

In some aspects, a LiDAR may be used to create a point cloud (also depth map), which can be a 3D representation of numerous dots (e.g., data points) spread throughout a 3D space. The LiDAR emits light and calculates the time in which it takes to be reflect back from an object(s) to the sensor to create each dot in the point cloud (e.g., the collected dots may be collected to represent a 3D image of the captured scene or environment). In some cases, a LiDAR may have inaccuracies in capturing a real-world scene or environment (e.g., the LiDAR sensor may have different outputs for capturing the same object at different times). In other words, the point cloud created using a LiDAR sensor may not accurately represent the captured scene. The inaccuracies in the point cloud may be caused by noise in the LiDAR output from different parameters including, but not limited to, intensity, distance (e.g., distance between the LiDAR sensor and an object), location such as XYZ coordinates (e.g., the 3D coordinates of an object), and/or incident angle (e.g., the angle between the normal of the surface and the LiDAR laser beam that hits the surface).

Described herein are systems, apparatuses, processes (also referred to as methods), and computer-readable media (collectively referred to as "systems and techniques") for modeling noise in sensor data (e.g., LiDAR data, etc.) using machine learning. As discussed above, in a real-world environment, when a LiDAR beam captures a scene, there may be noise or inaccuracies in the intensity and range measurements resulting in a noisy point cloud (e.g., due to unknowns like contamination, interaction of photons with non-analyzed material and environmental factors like water droplets or dust particles, etc and also inaccuracies in the time-of-flight and power measurements). In some aspects, in a simulation environment (also referred to as a simulation program), the output of a LiDAR sensor does not contain the same noise that is captured by a LiDAR sensor in a real-world environment. In other words, the LiDAR outputs can differ in a simulation environment compared to a real-world environment. As described herein, a simulation environment may include a lab environment (e.g., a lab or testing environment to test, characterize, and/or develop LiDAR sensors) and a virtual environment (e.g., a virtual or software simulation environment such as a metaverse or physics-based simulation). In some aspects, machine learning utilizing real world data (e.g., LiDAR data captured in a real-world environment) may be used to develop a noise model that, when combined with a point cloud derived from a simulation environment, can result in a noisy point cloud representative of a real-world environment. In other words, LiDAR outputs in a simulation environment can be combined with a machine learning based noise model to simulate LiDAR outputs of a real-world environment.

Various examples of the systems and techniques described herein for modeling sensor noise using machine learning are illustrated in FIG. 1 through FIG. 7 and described below.

Figure 1:
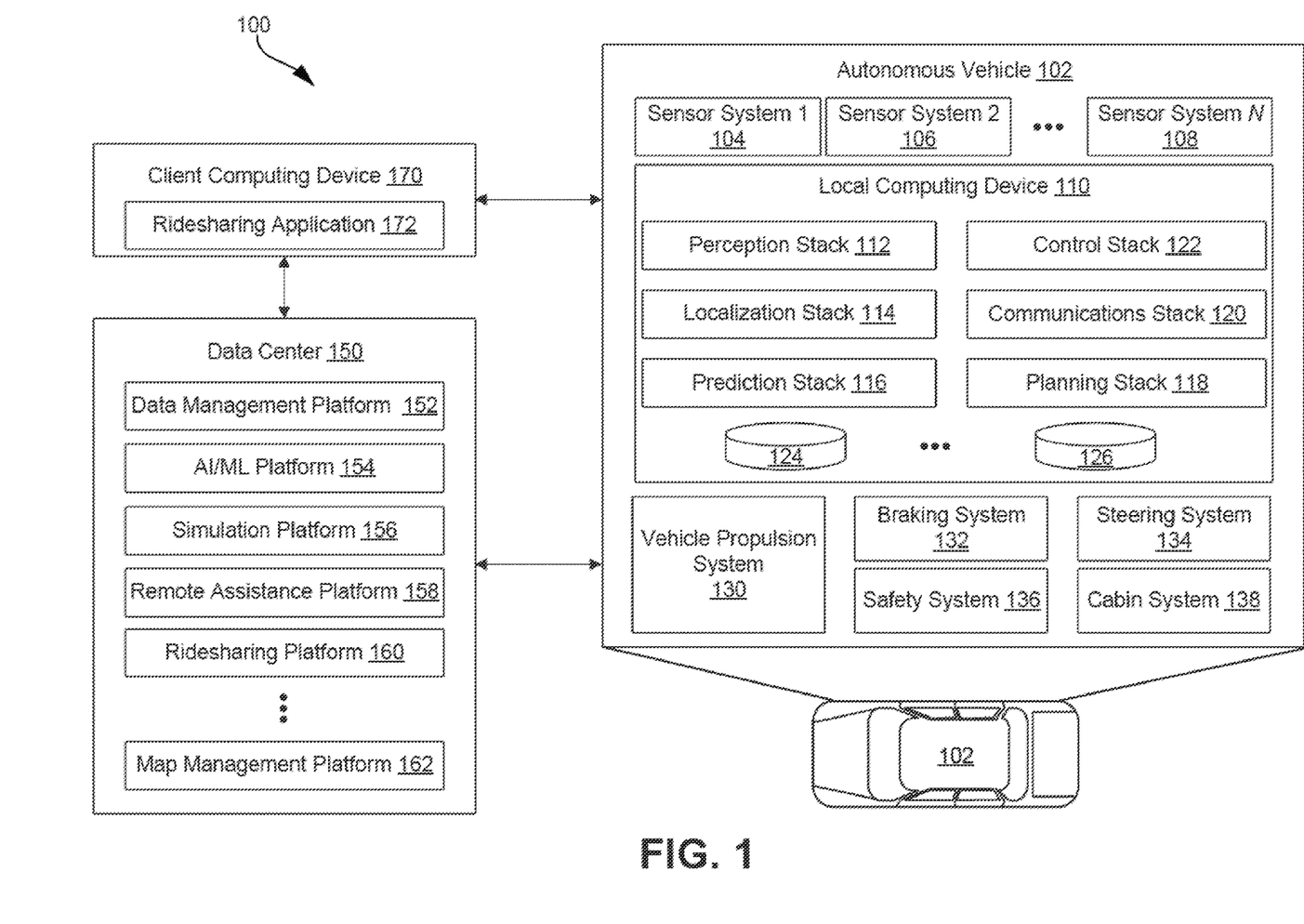
FIG. 1 illustrates an example system environment that can be used to facilitate autonomous vehicle (AV) navigation and routing operations, according to some aspects of the present disclosure.

FIG. 1 illustrates an example of an AV management system 100. One of ordinary skill in the art will understand that, for the AV management system 100 and any system discussed in the present disclosure, there can be additional or fewer components in similar or alternative configurations. The illustrations and examples provided in the present disclosure are for conciseness and clarity. Other examples may include different numbers and/or types of elements, but one of ordinary skill in the art will appreciate that such variations do not depart from the scope of the present disclosure.

In this example, the AV management system 100 includes an AV 102, a data center (also autonomous vehicle fleet management device, autonomous vehicle fleet management system, management system) 150, and a client computing device 170. The AV 102, the data center 150, and the client computing device 170 can communicate with one another over one or more networks (not shown), such as a public network (e.g., the Internet, an Infrastructure as a Service (IaaS) network, a Platform as a Service (PaaS) network, a Software as a Service (SaaS) network, other Cloud Service Provider (CSP) network, etc.), a private network (e.g., a Local Area Network (LAN), a private cloud, a Virtual Private Network (VPN), etc.), and/or a hybrid network (e.g., a multi-cloud or hybrid cloud network, etc.).

The AV 102 can navigate roadways without a human driver based on sensor signals generated by multiple sensor systems 104, 106, and 108. The sensor systems 104-108 can include different types of sensors and can be arranged about the AV 102. For instance, the sensor systems 104-108 can comprise Inertial Measurement Units (IMUs), cameras (e.g., still image cameras, video cameras, etc.), light sensors (e.g., LIDAR systems, ambient light sensors, infrared sensors, etc.), RADAR systems, GPS receivers, audio sensors (e.g., microphones, Sound Navigation and Ranging (SONAR) systems, ultrasonic sensors, etc.), engine sensors, speedometers, tachometers, odometers, altimeters, tilt sensors, impact sensors, airbag sensors, seat occupancy sensors, open/closed door sensors, tire pressure sensors, rain sensors, and so forth. For example, the sensor system 104 can be a camera system, the sensor system 106 can be a LIDAR system, and the sensor system 108 can be a RADAR system. Other examples may include any other number and type of sensors.

The AV 102 can also include several mechanical systems that can be used to maneuver or operate the AV 102. For instance, the mechanical systems can include a vehicle propulsion system 130, a braking system 132, a steering system 134, a safety system 136, and a cabin system 138, among other systems. The vehicle propulsion system 130 can include an electric motor, an internal combustion engine, or both. The braking system 132 can include an engine brake, brake pads, actuators, and/or any other suitable componentry configured to assist in decelerating the AV 102. The steering system 134 can include suitable componentry configured to control the direction of movement of the AV 102 during navigation. The safety system 136 can include lights and signal indicators, a parking brake, airbags, and so forth. The cabin system 138 can include cabin temperature control systems, in-cabin entertainment systems, and so forth. In some examples, the AV 102 might not include human driver actuators (e.g., steering wheel, handbrake, foot brake pedal, foot accelerator pedal, turn signal lever, window wipers, etc.) for controlling the AV 102. Instead, the cabin system 138 can include one or more client interfaces (e.g., Graphical User Interfaces (GUIs), Voice User Interfaces (VUIs), etc.) for controlling certain aspects of the mechanical systems 130-138.

The AV 102 can additionally include a local computing device 110 that is in communication with the sensor systems 104-108, the mechanical systems 130-138, the data center 150, and the client computing device 170, among other systems. The local computing device 110 can include one or more processors and memory, including instructions that can be executed by the one or more processors. The instructions can make up one or more software stacks or components responsible for controlling the AV 102; communicating with the data center 150, the client computing device 170, and other systems; receiving inputs from riders, passengers, and other entities within the AV's environment; logging metrics collected by the sensor systems 104-108; and so forth. In this example, the local computing device 110 includes a perception stack 112, a mapping and localization stack 114, a prediction stack 116, a planning stack 118, a communications stack 120, a control stack 122, an AV operational database 124, and an HD geospatial database 126, among other stacks and systems.

The perception stack 112 can enable the AV 102 to "see" (e.g., via cameras, LIDAR sensors, infrared sensors, etc.), "hear" (e.g., via microphones, ultrasonic sensors, RADAR, etc.), and "feel" (e.g., pressure sensors, force sensors, impact sensors, etc.) its environment using information from the sensor systems 104-108, the mapping and localization stack 114, the HD geospatial database 126, other components of the AV, and other data sources (e.g., the data center 150, the client computing device 170, third party data sources, etc.). The perception stack 112 can detect and classify objects and determine their current locations, speeds, directions, and the like. In addition, the perception stack 112 can determine the free space around the AV 102 (e.g., to maintain a safe distance from other objects, change lanes, park the AV, etc.). The perception stack 112 can also identify environmental uncertainties, such as where to look for moving objects, flag areas that may be obscured or blocked from view, and so forth. In some examples, an output of the prediction stack 116 can be a bounding area around a perceived object that can be associated with a semantic label that identifies the type of object that is within the bounding area, the kinematic of the object (information about its movement), a tracked path of the object, and a description of the pose of the object (its orientation or heading, etc.).

The mapping and localization stack 114 can determine the AV's position and orientation (pose) using different methods from multiple systems (e.g., GPS, IMUs, cameras, LIDAR, RADAR, ultrasonic sensors, the HD geospatial database 126, etc.). For example, in some examples, the AV 102 can compare sensor data captured in real-time by the sensor systems 104-108 to data in the HD geospatial database 126 to determine its precise (e.g., accurate to the order of a few centimeters or less) position and orientation. The AV 102 can focus its search based on sensor data from one or more first sensor systems (e.g., GPS) by matching sensor data from one or more second sensor systems (e.g., LIDAR). If the mapping and localization information from one system is unavailable, the AV 102 can use mapping and localization information from a redundant system and/or from remote data sources.

The prediction stack 116 can receive information from the mapping and localization stack 114 and objects identified by the perception stack 112 and predict a future path for the objects. In some examples, the prediction stack 116 can output several likely paths that an object is predicted to take along with a probability associated with each path. For each predicted path, the prediction stack 116 can also output a range of points along the path corresponding to a predicted location of the object along the path at future time intervals along with an expected error value for each of the points that indicates a probabilistic deviation from that point.

The planning stack 118 can determine how to maneuver or operate the AV 102 safely and efficiently in its environment. For example, the planning stack 118 can receive the location, speed, and direction of the AV 102, geospatial data, data regarding objects sharing the road with the AV 102 (e.g., pedestrians, bicycles, vehicles, ambulances, buses, cable cars, trains, traffic lights, lanes, road markings, etc.) or certain events occurring during a trip (e.g., emergency vehicle blaring a siren, intersections, occluded areas, street closures for construction or street repairs, double-parked cars, etc.), traffic rules and other safety standards or practices for the road, user input, and other relevant data for directing the AV 102 from one point to another and outputs from the perception stack 112, mapping and localization stack 114, and prediction stack 116. The planning stack 118 can determine multiple sets of one or more mechanical operations that the AV 102 can perform (e.g., go straight at a specified rate of acceleration, including maintaining the same speed or decelerating; turn on the left blinker, decelerate if the AV is above a threshold range for turning, and turn left; turn on the right blinker, accelerate if the AV is stopped or below the threshold range for turning, and turn right; decelerate until completely stopped and reverse; etc.), and select the best one to meet changing road conditions and events. If something unexpected happens, the planning stack 118 can select from multiple backup plans to carry out. For example, while preparing to change lanes to turn right at an intersection, another vehicle may aggressively cut into the destination lane, making the lane change unsafe. The planning stack 118 could have already determined an alternative plan for such an event. Upon its occurrence, it could help direct the AV 102 to go around the block instead of blocking a current lane while waiting for an opening to change lanes.

The control stack 122 can manage the operation of the vehicle propulsion system 130, the braking system 132, the steering system 134, the safety system 136, and the cabin system 138. The control stack 122 can receive sensor signals from the sensor systems 104-108 as well as communicate with other stacks or components of the local computing device 110 or a remote system (e.g., the data center 150) to effectuate operation of the AV 102. For example, the control stack 122 can implement the final path or actions from the multiple paths or actions provided by the planning stack 118. This can involve turning the routes and decisions from the planning stack 118 into commands for the actuators that control the AV's steering, throttle, brake, and drive unit.

The communications stack 120 can transmit and receive signals between the various stacks and other components of the AV 102 and between the AV 102, the data center 150, the client computing device 170, and other remote systems. The communications stack 120 can enable the local computing device 110 to exchange information remotely over a network, such as through an antenna array or interface that can provide a metropolitan WIFI network connection, a mobile or cellular network connection (e.g., Third Generation (3G), Fourth Generation (4G), Long-Term Evolution (LTE), 5th Generation (5G), etc.), and/or other wireless network connection (e.g., License Assisted Access (LAA), Citizens Broadband Radio Service (CBRS), MULTEFIRE, etc.). The communications stack 120 can also facilitate the local exchange of information, such as through a wired connection (e.g., a user's mobile computing device docked in an in-car docking station or connected via Universal Serial Bus (USB), etc.) or a local wireless connection (e.g., Wireless Local Area Network (WLAN), Low Power Wide Area Network (LPWAN), Bluetooth®, infrared, etc.).

The HD geospatial database 126 can store HD maps and related data of the streets upon which the AV 102 travels. In some examples, the HD maps and related data can comprise multiple layers, such as an areas layer, a lanes and boundaries layer, an intersections layer, a traffic controls layer, and so forth. The areas layer can include geospatial information indicating geographic areas that are drivable (e.g., roads, parking areas, shoulders, etc.) or not drivable (e.g., medians, sidewalks, buildings, etc.), drivable areas that constitute links or connections (e.g., drivable areas that form the same road) versus intersections (e.g., drivable areas where two or more roads intersect), and so on. The lanes and boundaries layer can include geospatial information of road lanes (e.g., lane centerline, lane boundaries, type of lane boundaries, etc.) and related attributes (e.g., direction of travel, speed limit, lane type, etc.). The lanes and boundaries layer can also include 3D attributes related to lanes (e.g., slope, elevation, curvature, etc.). The intersections layer can include geospatial information of intersections (e.g., crosswalks, stop lines, turning lane centerlines and/or boundaries, etc.) and related attributes (e.g., permissive, protected/permissive, or protected only left turn lanes; legal or illegal U-turn lanes; permissive or protected only right turn lanes; etc.). The traffic controls lane can include geospatial information of traffic signal lights, traffic signs, and other road objects and related attributes.

The AV operational database 124 can store raw AV data generated by the sensor systems 104-108, stacks 112-122, and other components of the AV 102 and/or data received by the AV 102 from remote systems (e.g., the data center 150, the client computing device 170, etc.). In some examples, the raw AV data can include HD LIDAR point cloud data, image data, RADAR data, GPS data, and other sensor data that the data center 150 can use for creating or updating AV geospatial data or for creating simulations of situations encountered by AV 102 for future testing or training of various machine learning algorithms that are incorporated in the local computing device 110.

The data center 150 can be a private cloud (e.g., an enterprise network, a co-location provider network, etc.), a public cloud (e.g., an Infrastructure as a Service (IaaS) network, a Platform as a Service (PaaS) network, a Software as a Service (SaaS) network, or other Cloud Service Provider (CSP) network), a hybrid cloud, a multi-cloud, and so forth. The data center 150 can include one or more computing devices remote to the local computing device 110 for managing a fleet of AVs and AV-related services. For example, in addition to managing the AV 102, the data center 150 may also support a ridesharing service, a delivery service, a remote/roadside assistance service, street services (e.g., street mapping, street patrol, street cleaning, street metering, parking reservation, etc.), and the like.

The data center 150 can send and receive various signals to and from the AV 102 and the client computing device 170. These signals can include sensor data captured by the sensor systems 104-108, roadside assistance requests, software updates, ridesharing pick-up and drop-off instructions, and so forth. In this example, the data center 150 includes a data management platform 152, an Artificial Intelligence/Machine Learning (AI/ML) platform 154, a simulation platform 156, a remote assistance platform 158, a ridesharing platform 160, and a map management platform 162, among other systems.

The data management platform 152 can be a "big data" system capable of receiving and transmitting data at high velocities (e.g., near real-time or real-time), processing a large variety of data and storing large volumes of data (e.g., terabytes, petabytes, or more of data). The varieties of data can include data having different structured (e.g., structured, semi-structured, unstructured, etc.), data of different types (e.g., sensor data, mechanical system data, ridesharing service, map data, audio, video, etc.), data associated with different types of data stores (e.g., relational databases, key-value stores, document databases, graph databases, column-family databases, data analytic stores, search engine databases, time series databases, object stores, file systems, etc.), data originating from different sources (e.g., AVs, enterprise systems, social networks, etc.), data having different rates of change (e.g., batch, streaming, etc.), or data having other heterogeneous characteristics. The various platforms and systems of the data center 150 can access data stored by the data management platform 152 to provide their respective services.

The AI/ML platform 154 can provide the infrastructure for training and evaluating machine learning algorithms for operating the AV 102, the simulation platform 156, the remote assistance platform 158, the ridesharing platform 160, the map management platform 162, and other platforms and systems. Using the AI/ML platform 154, data scientists can prepare data sets from the data management platform 152; select, design, and train machine learning models; evaluate, refine, and deploy the models; maintain, monitor, and retrain the models; and so on.

The simulation platform 156 can enable testing and validation of the algorithms, machine learning models, neural networks, and other development efforts for the AV 102, the remote assistance platform 158, the ridesharing platform 160, the map management platform 162, and other platforms and systems. The simulation platform 156 can replicate a variety of driving environments and/or reproduce real-world scenarios from data captured by the AV 102, including rendering geospatial information and road infrastructure (e.g., streets, lanes, crosswalks, traffic lights, stop signs, etc.) obtained from a cartography platform (e.g., map management platform 162); modeling the behavior of other vehicles, bicycles, pedestrians, and other dynamic elements; simulating inclement weather conditions, different traffic scenarios; and so on.

The remote assistance platform 158 can generate and transmit instructions regarding the operation of the AV 102. For example, in response to an output of the AI/ML platform 154 or other system of the data center 150, the remote assistance platform 158 can prepare instructions for one or more stacks or other components of the AV 102.

The ridesharing platform 160 can interact with a customer of a ridesharing service via a ridesharing application 172 executing on the client computing device 170. The client computing device 170 can be any type of computing system, including a server, desktop computer, laptop, tablet, smartphone, smart wearable device (e.g., smartwatch, smart eyeglasses or other Head-Mounted Display (HMD), smart ear pods, or other smart in-ear, on-ear, or over-ear device, etc.), gaming system, or other general purpose computing device for accessing the ridesharing application 172. The client computing device 170 can be a customer's mobile computing device or a computing device integrated with the AV 102 (e.g., the local computing device 110). The ridesharing platform 160 can receive requests to pick up or drop off from the ridesharing application 172 and dispatch the AV 102 for the trip.

Map management platform 162 can provide a set of tools for the manipulation and management of geographic and spatial (geospatial) and related attribute data. The data management platform 152 can receive LIDAR point cloud data, image data (e.g., still image, video, etc.), RADAR data, GPS data, and other sensor data (e.g., raw data) from one or more AVs 102, Unmanned Aerial Vehicles (UAVs), satellites, third-party mapping services, and other sources of geospatially referenced data. The raw data can be processed, and map management platform 162 can render base representations (e.g., tiles (2D), bounding volumes (3D), etc.) of the AV geospatial data to enable users to view, query, label, edit, and otherwise interact with the data. Map management platform 162 can manage workflows and tasks for operating on the AV geospatial data. Map management platform 162 can control access to the AV geospatial data, including granting or limiting access to the AV geospatial data based on user-based, role-based, group-based, task-based, and other attribute-based access control mechanisms. Map management platform 162 can provide version control for the AV geospatial data, such as to track specific changes that (human or machine) map editors have made to the data and to revert changes when necessary. Map management platform 162 can administer release management of the AV geospatial data, including distributing suitable iterations of the data to different users, computing devices, AVs, and other consumers of HD maps. Map management platform 162 can provide analytics regarding the AV geospatial data and related data, such as to generate insights relating to the throughput and quality of mapping tasks.

In some examples, the map viewing services of map management platform 162 can be modularized and deployed as part of one or more of the platforms and systems of the data center 150. For example, the AI/ML platform 154 may incorporate the map viewing services for visualizing the effectiveness of various object detection or object classification models, the simulation platform 156 may incorporate the map viewing services for recreating and visualizing certain driving scenarios, the remote assistance platform 158 may incorporate the map viewing services for replaying traffic incidents to facilitate and coordinate aid, the ridesharing platform 160 may incorporate the map viewing services into the client application 172 to enable passengers to view the AV 102 in transit en route to a pick-up or drop-off location, and so on.

Figure 2:
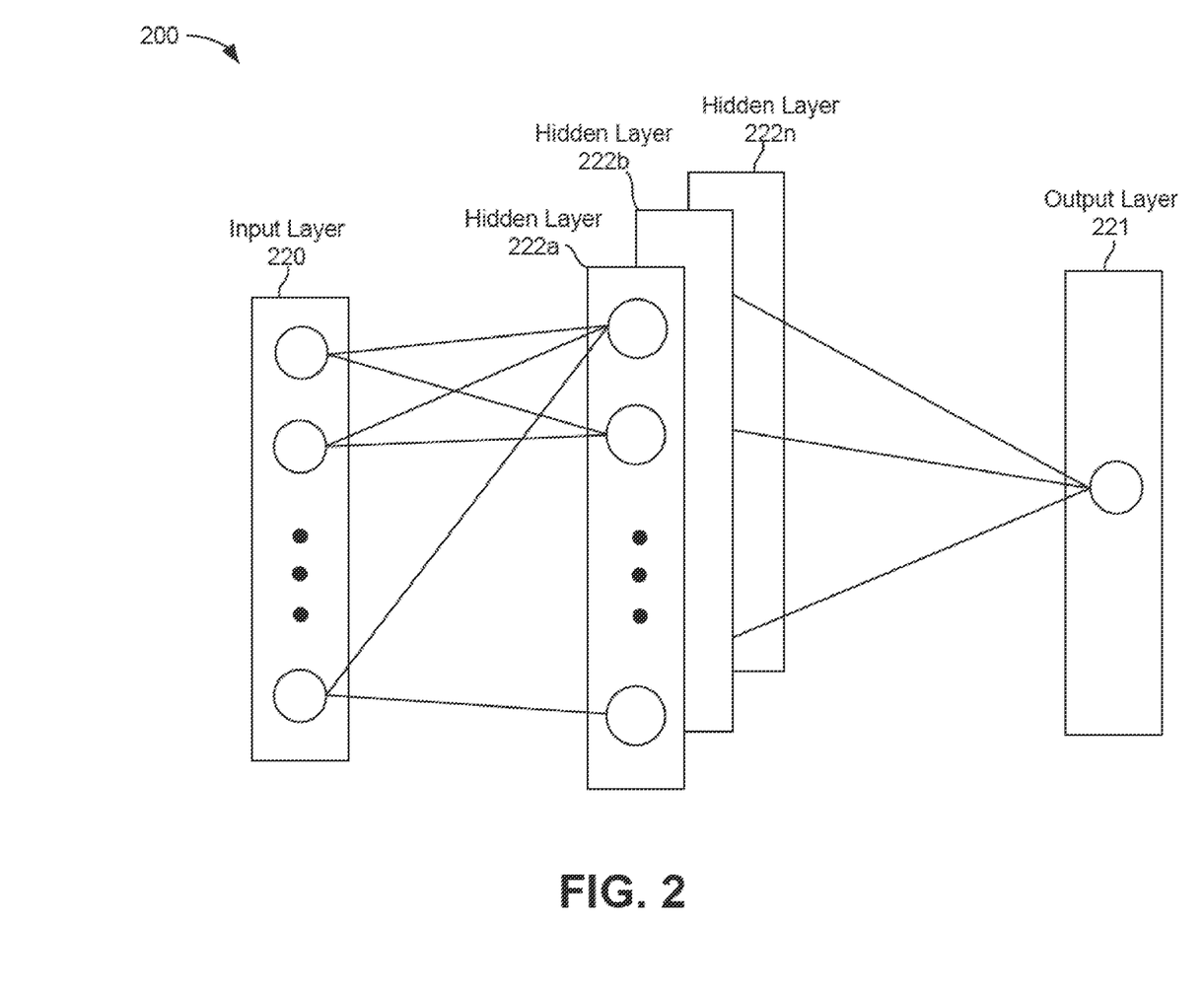
FIG. 2 illustrates an example of a deep learning neural network that can be used to implement a noise modeling process, according to some aspects of the present disclosure.

With reference to FIG. 2, the disclosure now turns to a further discussion of models that can be used through the environments and techniques described herein. FIG. 2 illustrates an example of a deep learning neural network 200 (also DNN, deep neural network) that can be used to implement all or a portion of the aspects described herein. For example, neural network 200 can be used to implement a perception stack (or perception system) as discussed above. In another example, neural network 200 can be used with real-world data (e.g., real-world data 410 as discussed in FIG. 4) collected from a sensor system (e.g., LiDAR system 403 as discussed in FIG. 4) to develop a noise model (e.g., DNN noise model 408 as discussed in FIG. 4) for use in a simulation environment (e.g., simulation environment 430 as discussed in FIG. 4). In some examples, neural network 200 may be implemented at AV 102, data center 150, and/or client computing device 170.

In some examples, an input layer 220 can be configured to receive sensor data and/or data relating to an environment surrounding an AV. The neural network 200 includes multiple hidden layers 222a, 222b, through 222n. The hidden layers 222a, 222b, through 222n include "n" number of hidden layers, where "n" is an integer greater than or equal to one. The number of hidden layers can be made to include as many layers as needed for the given application. The neural network 200 further includes an output layer 221 that provides an output resulting from the processing performed by the hidden layers 222a, 222b, through 222n.

The neural network 200 is a multi-layer neural network of interconnected nodes. Each node can represent a piece of information. Information associated with the nodes is shared among the different layers and each layer retains information as information is processed. In some cases, the neural network 200 can include a feed-forward network, in which case there are no feedback connections where outputs of the network are fed back into itself. In some cases, the neural network 200 can include a recurrent neural network, which can have loops that allow information to be carried across nodes while reading in input.

Information can be exchanged between nodes through node-to-node interconnections between the various layers. Nodes of the input layer 220 can activate a set of nodes in the first hidden layer 222a. For example, as shown, each of the input nodes of the input layer 220 is connected to each of the nodes of the first hidden layer 222a. The nodes of the first hidden layer 222a can transform the information of each input node by applying activation functions to the input node information. The information derived from the transformation can then be passed to and can activate the nodes of the next hidden layer 222b, which can perform their own designated functions. Example functions include convolutional, up-sampling, data transformation, and/or any other suitable functions. The output of the hidden layer 222b can then activate nodes of the next hidden layer, and so on. The output of the last hidden layer 222n can activate one or more nodes of the output layer 221, at which an output is provided. In some cases, while nodes in the neural network 200 are shown as having multiple output lines, a node can have a single output and all lines shown as being output from a node represent the same output value.

In some cases, each node or interconnection between nodes can have a weight that is a set of parameters derived from the training of the neural network 200. Once the neural network 200 is trained, it can be referred to as a trained neural network, which can be used to classify one or more activities. For example, an interconnection between nodes can represent a piece of information learned about the interconnected nodes. The interconnection can have a tunable numeric weight that can be tuned (e.g., based on a training dataset), allowing the neural network 200 to be adaptive to inputs and able to learn as more and more data is processed.

The neural network 200 is pre-trained to process the features from the data in the input layer 220 using the different hidden layers 222a, 222b, through 222n in order to provide the output through the output layer 221.

In some cases, the neural network 200 can adjust the weights of the nodes using a training process called backpropagation. A backpropagation process can include a forward pass, a loss function, a backward pass, and a weight update. The forward pass, loss function, backward pass, and parameter/weight update is performed for one training iteration. The process can be repeated for a certain number of iterations for each set of training data until the neural network 200 is trained well enough so that the weights of the layers are accurately tuned.

To perform training, a loss function can be used to analyze error in the output. Any suitable loss function definition can be used, such as a Cross-Entropy loss. Another example of a loss function includes the mean squared error (MSE), defined as $E\_total = \Sigma(\frac{1}{2}(target - output)^2)$. The loss can be set to be equal to the value of E_total.

The loss (or error) will be high for the initial training data since the actual values will be much different than the predicted output. The goal of training is to minimize the amount of loss so that the predicted output is the same as the training output. The neural network 200 can perform a backward pass by determining which inputs (weights) most contributed to the loss of the network and can adjust the weights so that the loss decreases and is eventually minimized.

The neural network 200 can include any suitable deep network. One example includes a Convolutional Neural Network (CNN), which includes an input layer and an output layer, with multiple hidden layers between the input and out layers. The hidden layers of a CNN include a series of convolutional, nonlinear, pooling (for downsampling), and fully connected layers. The neural network 200 can include any other deep network other than a CNN, such as an autoencoder, Deep BeliefNets (DBNs), Recurrent Neural Networks (RNNs), among others.

As understood by those of skill in the art, machine-learning based classification techniques can vary depending on the desired implementation. For example, machine-learning classification schemes can utilize one or more of the following, alone or in combination: hidden Markov models; RNNs; CNNs; deep learning; Bayesian symbolic methods; Generative Adversarial Networks (GANs); support vector machines; image registration methods; and applicable rule-based systems. Where regression algorithms are used, they may include but are not limited to: a Stochastic Gradient Descent Regressor, a Passive Aggressive Regressor, etc.

Machine learning classification models can also be based on clustering algorithms (e.g., a Mini-batch K-means clustering algorithm), a recommendation algorithm (e.g., a Min-wise Hashing algorithm, or Euclidean Locality-Sensitive Hashing (LSH) algorithm), and/or an anomaly detection algorithm, such as a local outlier factor. Additionally, machine-learning models can employ a dimensionality reduction approach, such as, one or more of: a Mini-batch Dictionary Learning algorithm, an incremental Principal Component Analysis (PCA) algorithm, a Latent Dirichlet Allocation algorithm, and/or a Mini-batch K-means algorithm, etc.

Figure 3:
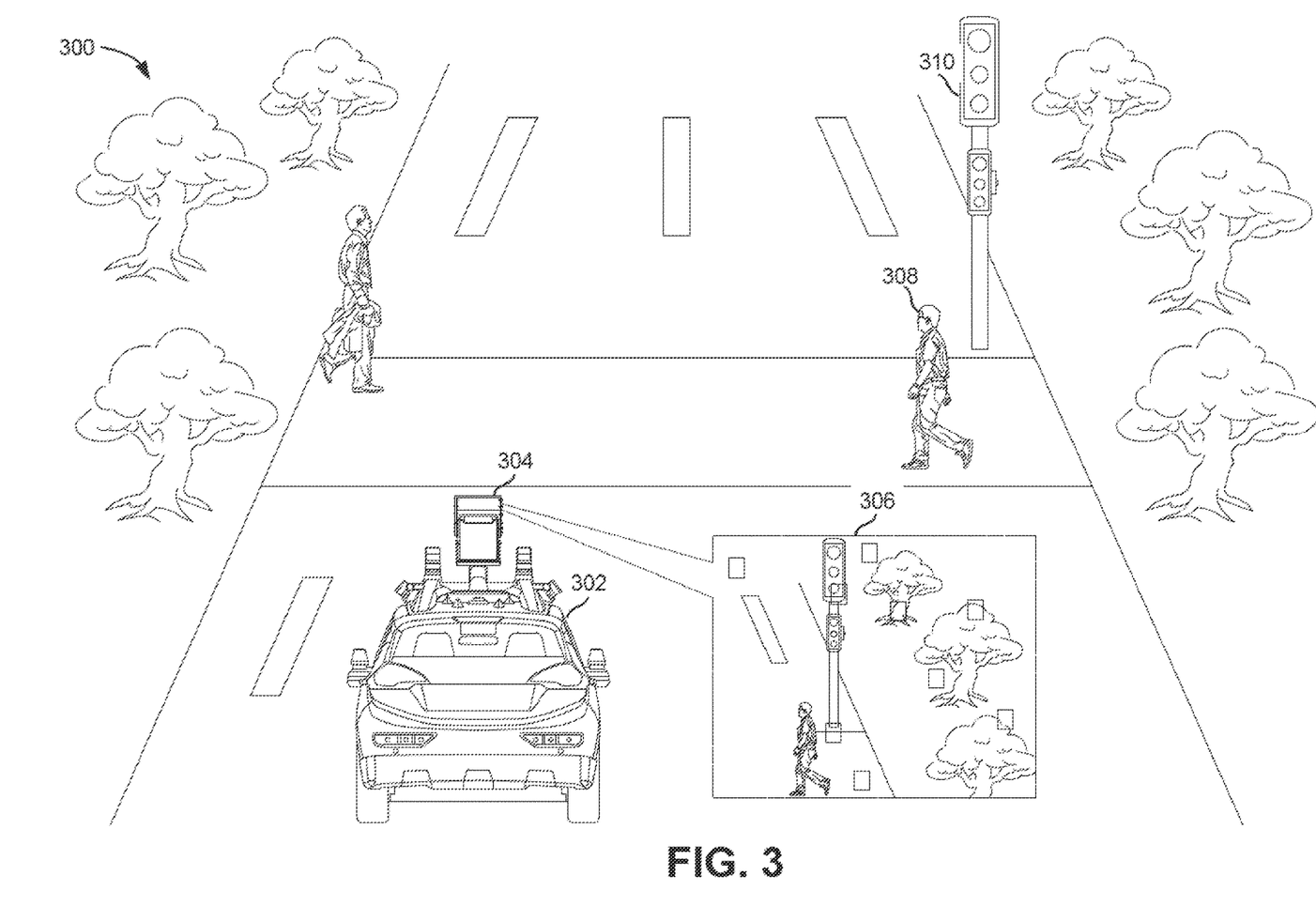
FIG. 3 illustrates an example system for noise modeling using machine learning, according to some aspects of the present disclosure.

FIG. 3 illustrates an example system 300 for noise modeling using machine learning, according to some aspects of the present disclosure. The system 300 includes AV 302, sensor system 304, point cloud 306, first object 308, and second object 310. In some cases, the system 300 may represent a real-world environment in which an AV 302 is navigating autonomously. As illustrated in FIG. 3, an AV 302 can include a sensor system 304 to capture the surrounding environment. The sensor system 304 may be the same as or different than sensor system 104, 106, or 108 illustrated in FIG. 1. For example, sensor system 304 may include a LiDAR system which can generate a point cloud 306 (e.g., point cloud 306 is an output of a LiDAR system).

As discussed above, a point cloud 306 (e.g., a set of data points in space, a depth map, etc.) can include or provide a 3D representation of numerous dots (e.g., data points such as XYZ position, intensity, etc.) spread throughout a 3D space. The LiDAR system emits light and calculates the time in which it takes to be reflect back into the sensor to create each dot as illustrated in point cloud 306. In some cases, in a real-world environment, a point cloud may not accurately capture a scene and/or an object in a scene (e.g., first object 306 and/or second object 308). The inaccuracies in the point cloud may be caused by noise in the LiDAR output which can result from various parameters such as intensity, distance, location (e.g., XYZ coordinates), orientation, incident angle, the material and/or surface of the captured object, and/or other parameters. For example, first object 308 (e.g., a pedestrian) and second object 310 (e.g., a traffic light) can have different material properties which can affect the LiDAR output parameters described above. A point cloud generated in a real-world environment can be considered as a noisy point cloud due to the noise in the LiDAR output.

In some aspects, a simulation environment (e.g., a virtual environment, a synthetic environment, a metaverse, etc.) may represent a virtual world or scene that mimics aspects of the physical world using technologies including, but not limited to, virtual reality (VR), augmented reality (AR), artificial intelligence (AI), simulation technologies, and/or social media, among others. In some examples, system 300 may represent a simulation environment in which AV 302, sensor system 304, first object 308, and second object 310 are also in a simulation environment. In a simulation environment, the point cloud 306 may not be equivalent to a point cloud generated in a real-world environment. For example, for a simulation environment with synthetic objects (e.g., digital or software-based objects) that is an analogous representation of a real-world environment in software, the generated point cloud 306 may have different values (e.g., XYZ coordinates, intensity values, depth values, etc.) compared to a point cloud generated by real/physical sensors in a real-world environment. The difference between point cloud 306 generated in a simulation environment with a noisy point cloud generated in a real-world environment can be due to a lack of noise in the point cloud 306 generated in the simulation environment.

In some examples, a noise model may be created that, when combined with point cloud 306 generated in a simulation environment, minimizes or eliminates the differences between the point cloud 306 combined with the noise model and the noisy point cloud from the real-world environment (e.g., the point cloud generated in a real-world environment). For example, consider a first image generated from a point cloud 306 in a simulation environment, and a second image generated from a point cloud (e.g., a noisy point cloud) from a real-world environment. In addition, consider a software tool (e.g., software program) called a discriminator that takes an input image and outputs a result of one for real world or zero for simulation (e.g., the discriminator software tool determines if the inputted image derived from a point cloud 306 is from a simulation environment or a real-world environment).

In some examples, the noise model can include any sensor system noise, such as a LiDAR system noise modeled by a DNN. For example, the noise model can model noise such as, for example and without limitation, LiDAR backscatter (water droplets, dust particles, etc.), background noise, contour noise from LiDAR data, thermal noise, dark current noise, sunlight noise, electrical noise at a photoreceiver of a LiDAR system, atmospheric noise, measurement inaccuracies, signal attenuation, noise from stray lights, high-frequency noise, distance/depth noise, signal artifacts, intensity noise, and/or any other sensor noise.

As discussed above, when the point cloud 306 from the simulation environment combined with the noise model results in a new point cloud (e.g., a simulated noisy point cloud), the discriminator may compare the simulated noisy point cloud with a noisy point cloud from the real-world and determine that the noisy point clouds match (e.g., the discriminator may output a value of one indicating that the simulated noisy point cloud matches the noisy point cloud from the real-world). In other words, the simulated noisy point cloud (e.g., the point cloud 306 combined with the noise model in the simulation environment) may be indistinguishable from the point cloud from a real-world environment (e.g., the noisy point cloud from the real-world environment). In some aspects, the noise model may be created using a deep neural network (e.g., DNN 200 as discussed above with respect to FIG. 2) which can use real-world data (e.g., real-world data can be derived from a sensor system 304 in a real-world environment, such as a LiDAR system generating a real-world point cloud). In some cases, the deep neural network may be trained by computing a gradient and updating the weights of the deep neural network based on the computed gradient. For example, the gradient can be computed from the differences between the real-world data and the current version of the noise model. Those skilled in the art will appreciate additional examples of how to train a deep neural network.

Figure 4:
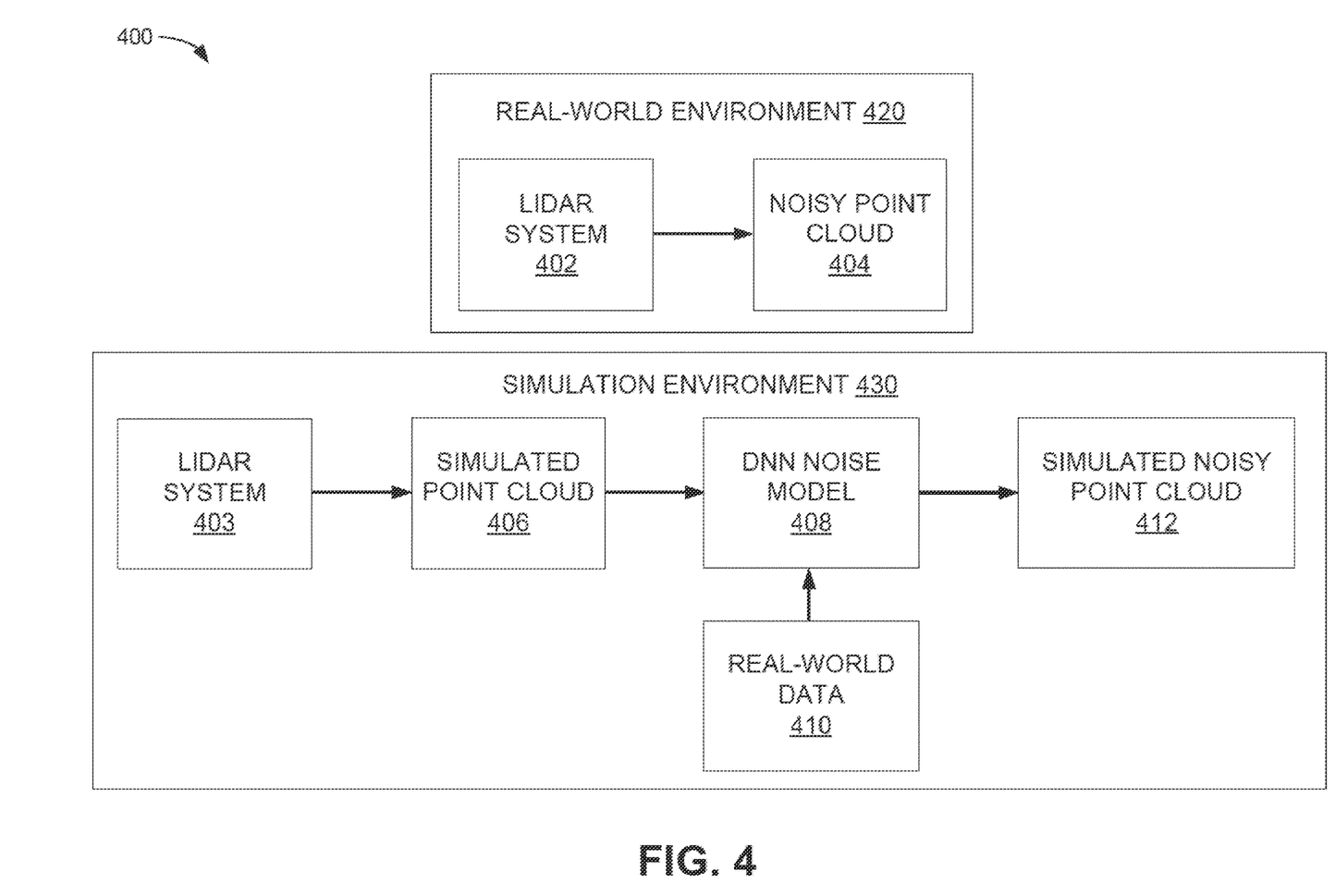
FIG. 4 illustrates another example system for noise modeling using machine learning, according to some aspects of the present disclosure.

FIG. 4 illustrates another example system 400 for noise modeling using machine learning, according to some aspects of the present disclosure. The system 400 includes real-world environment 420 and simulation environment 430. The real-world environment 420 includes LiDAR system 402 and noisy point cloud 404. The simulation environment 430 includes LiDAR system 403, simulated point cloud 406, deep neural network (DNN) noise model 408, real-world data 410, and simulated noisy point cloud 412 (e.g., all the elements illustrated in simulation environment 430 are software-based).

The real-world environment 420 may represent a real-world environment where a sensor system can collect data pertaining to a surrounding scene in the real-world environment. In some aspects, the sensor system may be associated with autonomous vehicles, helicopters, planes, or other mechanical systems, and can be used to capture data about the real-world environment. In one example, the sensor system may include a LiDAR system 402 that can emit light and calculate the time in which the light reflects back from an object(s) to the LiDAR system 402. The calculated time can be used to create a noisy point cloud 404. As discussed above in FIG. 3, in a real-world environment 420, LiDAR generates a noisy point cloud 404 due to variations in LiDAR parameters such as, for example and without limitation, intensity, distance from sensor, location (e.g., XYZ coordinates), surface characteristics, and/or material.

The simulation environment 430 may represent a simulation environment where a sensor system can collect data pertaining to a surrounding simulation environment. For example, a simulation environment 430 may represent a virtual world based in software that includes objects and/or elements that can be detected by a sensor system such as a LiDAR system 403 (e.g., LiDAR system 403 is also based in software in the simulation environment 430). In the simulation environment 430, LiDAR system 403 captures the surrounding objects in the simulation environment 430 to output a simulated point cloud 406. As discussed above with respect to FIG. 3, simulated point cloud 406 does not have the noise that is present in noisy point cloud 404 generated from the real-world environment 420. The lack of noise in the simulated point cloud 406 can create inaccuracies in the simulated point cloud 406 relative to the noisy point cloud 404 generated in the real-world environment.

The simulated point cloud 406 can be inputted into DNN noise model 408 (e.g., DNN 200 as illustrated in FIG. 2) which can generate simulated noisy point cloud 412. The DNN noise model 408 can be trained using real world data 410 which can improve the DNN noise model 408 by updating the weights of the DNN noise model 408 by calculating gradients between the real-world data 410 and the DNN noise model 408. In other words, the simulated noisy point cloud 412 more accurately represents the noisy point cloud 404 by training DNN noise model 408 with real world data 410. Those of ordinary skill in the art will appreciate additional examples of how to train DNN noise model 408.

In some examples, the DNN noise model 408 can include any sensor system noise, such as a LiDAR system noise, modeled by a DNN. For example, the DNN noise model 408 can model noise such as, for example and without limitation, LiDAR backscatter, background noise, contour noise from LiDAR data, thermal noise, dark current noise, sunlight noise, electrical noise at a photoreceiver of a LiDAR system, atmospheric noise, measurement inaccuracies, signal attenuation, noise from stray lights, high-frequency noise, distance/depth noise, signal artifacts, and/or any other sensor noise.

Figure 5:
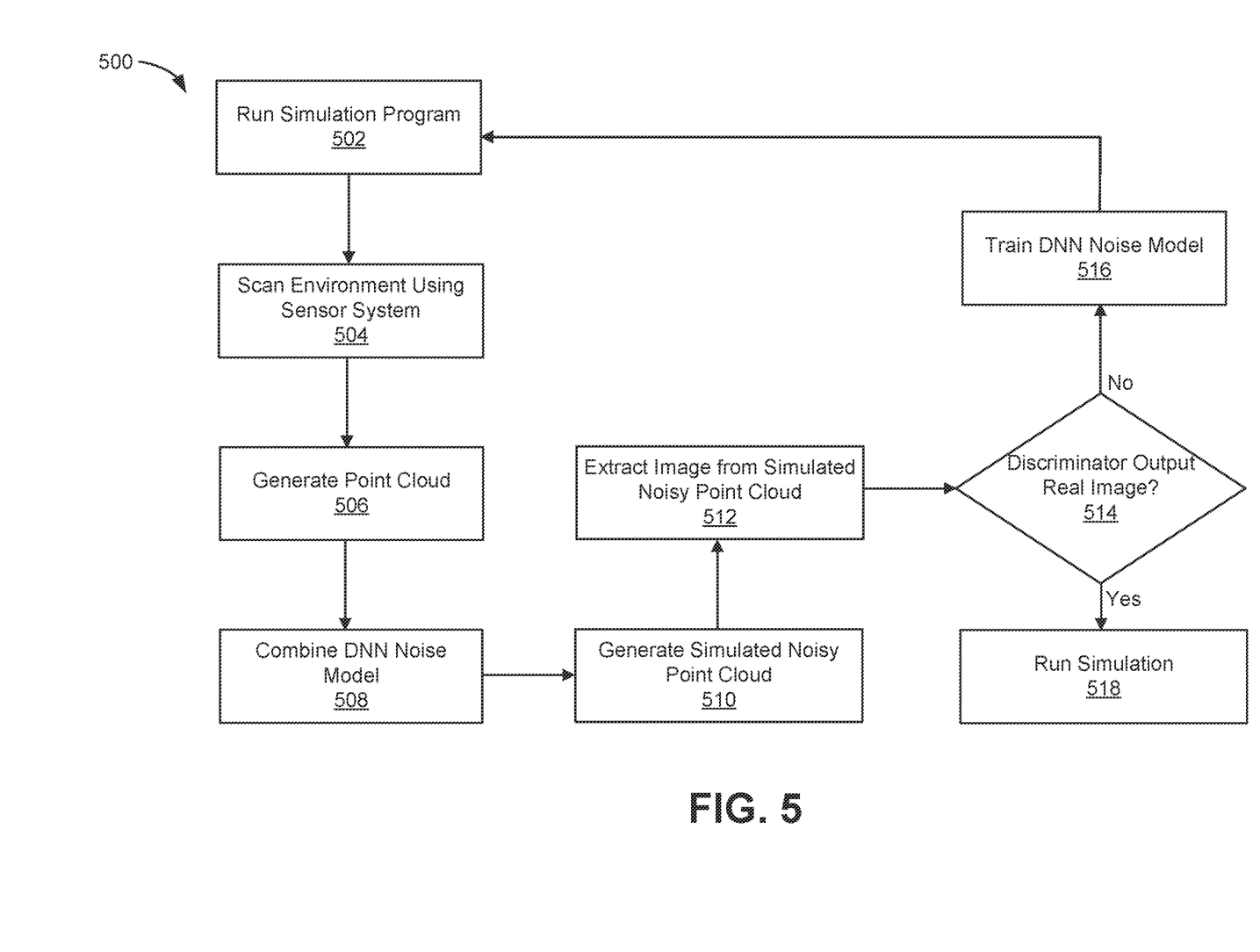
FIG. 5 illustrates an example of a process for noise modeling using machine learning, according to some aspects of the present disclosure.

FIG. 5 illustrates an example of a process 500 for noise modeling using machine learning, according to some aspects of the present disclosure. At block 502, the process 500 can include running a simulation program (e.g., a software program with a simulation environment 430). The simulation program may include a simulation environment (e.g., a simulation of a real-world environment such as simulation environment 430) with digital or software assets and objects that can be scanned or detected by a simulated sensor system (e.g., LiDAR system 403).

At block 504, the process 500 can include scanning, by a sensor system in the simulation environment, the simulated environment associated with the sensor system (e.g., LiDAR system 403 can scan simulation environment 430). For example, LiDAR system 403 in the simulation environment 430 can scan digital assets or virtual objects and calculate the same parameters (e.g., intensity, location (e.g., XYZ coordinates), incident angle, orientation, etc.) as the parameters calculated by a sensor system in a real-world environment (e.g., real-world environment 420). In some examples, the sensor system in the simulation environment may be associated with an autonomous vehicle, plane, helicopter, or other mechanical system.

At block 506, the process 500 can include generating a point cloud in the simulation environment. For example, a point cloud may be generated from a LiDAR sensor associated with a simulated autonomous vehicle. The point cloud generated may not have the same noise profile as a point cloud generated in a real-world environment.

At block 508, the process 500 can include combining a deep neural network (DNN) noise model (e.g., DNN noise model 408) with the generated point cloud from block 506. For example, by combining the DNN noise model with the point cloud from block 506, a simulated noisy point cloud may be generated at block 510. The simulated noisy point cloud can simulate a point cloud generated from a real-world environment. In some cases, the DNN noise model may be trained so that the simulated noisy point cloud from the simulation environment is an accurate representation (e.g., within a specified tolerance) of a noisy point cloud (e.g., noisy point cloud 404) from a real-world environment.

The DNN noise model can include any LiDAR system noise modeled by a DNN. For example, the DNN noise model can include modeled noise such as, for example and without limitation, LiDAR backscatter, background noise, contour noise from LiDAR data, thermal noise, dark current noise, sunlight noise, electrical noise at a photoreceiver of the LiDAR system, atmospheric noise, measurement inaccuracies, signal attenuation, noise from stray lights, high-frequency noise, signal artifacts, and/or any other sensor noise.

At block 512, the process 500 can include extracting an image from the simulated noisy point cloud generated at block 510. For example, an image or sample set of data points may be extracted from the simulated noisy point cloud to input into a discriminator (e.g., a software tool).

At block 514, the process 500 can include providing the extracted image from the simulated noisy point cloud to a discriminator. The discriminator can include an algorithm or model, such as a neural network classifier or a discriminative neural network, that can determine whether the inputted image is derived from a real-world environment or not. If the simulated noisy point cloud generated at block 510 (e.g., which is based on the DNN noise model) accurately represents a noisy point cloud from a real-world environment, the discriminator may also determine that the extracted image is from a real-world environment (e.g., even though the extracted image is actually from a simulated environment combined with the DNN noise model). In other words, if the DNN noise model from block 508 is adding noise that accurately reflects noise in a real-world environment, then the DNN noise model is functioning correctly, and the process 500 can continue to block 518.

At block 518, the simulation is functioning correctly since the simulated noisy point cloud accurately reflects a noisy point cloud from a real-world environment. If a determination is made that the discriminator output indicates that the image is not a real image, the process 500 at block 516 can train the DNN noise model. In other words, the DNN noise model may take real-world data (e.g., real-world data 410 collected from a sensor system such as LiDAR system 402 from a real-world environment 420) and change the DNN noise model's weighting (e.g., based on the gradients calculated from the real-world data and the DNN noise model). The process 500 may then return back to block 502 to restart the process 500 with an updated DNN noise model.

Figure 6:
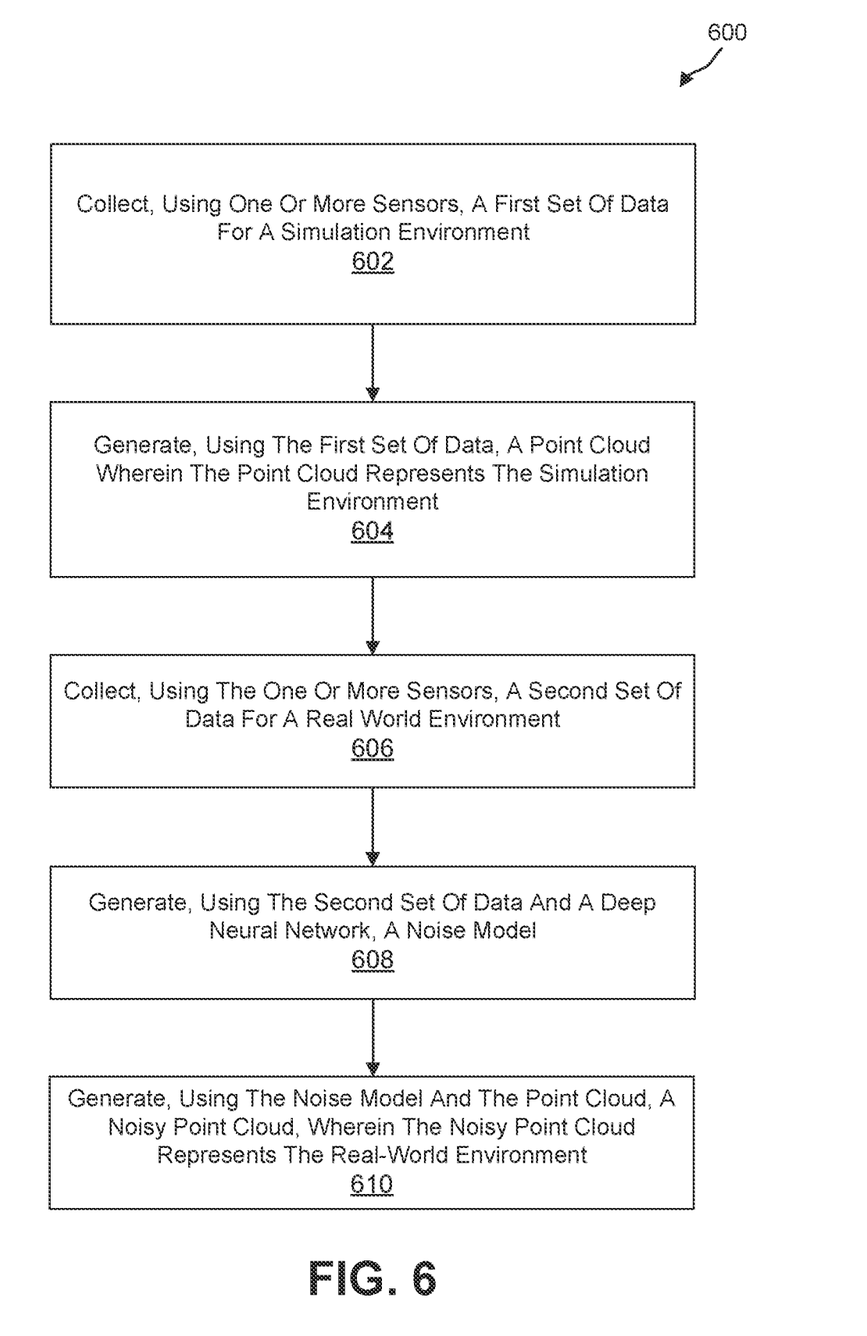
FIG. 6 illustrates another example of a process for noise modeling using machine learning, according to some aspects of the present disclosure.

FIG. 6 illustrates another example of a process 600 for noise modeling using machine learning, according to some aspects of the present disclosure. At block 602, the process 600 includes collecting, using one or more sensors, a first set of data for a simulation environment. For example, a sensor system such as a LiDAR system (e.g., LiDAR system 403) can collect data from the surrounding environment (e.g., simulation environment 430). The sensor system may be associated with or attached to an autonomous vehicle (e.g., AV 302).

At block 604, the process 600 includes generating, using the first set of data, a point cloud that represents and/or describes the simulation environment. For example, LiDAR system 403 may generate a simulated point cloud 406 (e.g., which is generated from simulation environment 430).

At block 606, the process 600 includes collecting, using the one or more sensors, a second set of data for a real-world environment. For example, LiDAR system 402 may collect data from a real-world environment 420.

At block 608, the process 600 includes generating, using the second set of data and a deep neural network, a noise model. For example, a noise model (e.g., DNN noise model 408) can be generated using real-world data 410 (e.g., data collected from real world environment 420) and a deep neural network (e.g., DNN 200). In some examples, the noise model can include a sensor system noise, such as a LiDAR system noise, modeled by a DNN. For example, the noise model can include modeled noise such as, for example and without limitation, LiDAR backscatter, background noise, contour noise from LiDAR data, thermal noise, dark current noise, sunlight noise, electrical noise at a photoreceiver of the LiDAR system, atmospheric noise, measurement inaccuracies, signal attenuation, noise from stray lights, high-frequency noise, signal artifacts, and/or any other noise.

At block 610, the process 600 includes generating, using the noise model and the point cloud, a noisy point cloud. The noisy point cloud can represent and/or describe the real-world environment. For example, the point cloud (e.g., simulated point cloud 406) generated from the simulation environment 430 can be combined with the noise model (e.g., DNN noise model 408) to generate a noisy point cloud (e.g., simulated noisy point cloud 412) that represents and/or describes a real-world environment 420. In other words, the noisy point cloud (e.g., simulated noisy point cloud 412), which was created from a simulation environment 430, is within a threshold proximity or within a specified tolerance of noisy point cloud 404.

In some cases, the process 600 can include computing, using the second set of data and the noise model, a set of gradients. For example, a set of gradients may be calculated based on the real-world data 410 and the DNN noise model 408. In other words, the real-world data 410 is propagated to the DNN noise model 408 to improve its performance (e.g., to improve the ability for the DNN noise model 408 to generate a simulated noisy point cloud 412 that is within close proximity to noisy point cloud 404).

In some cases, the process 600 can include updating, using the set of gradients, a set of weights for the deep neural network. For example, the DNN noise model 408 may have its respective weights updated based on the calculated gradients between the real-world data 410 and the DNN noise model 408.

Figure 7:
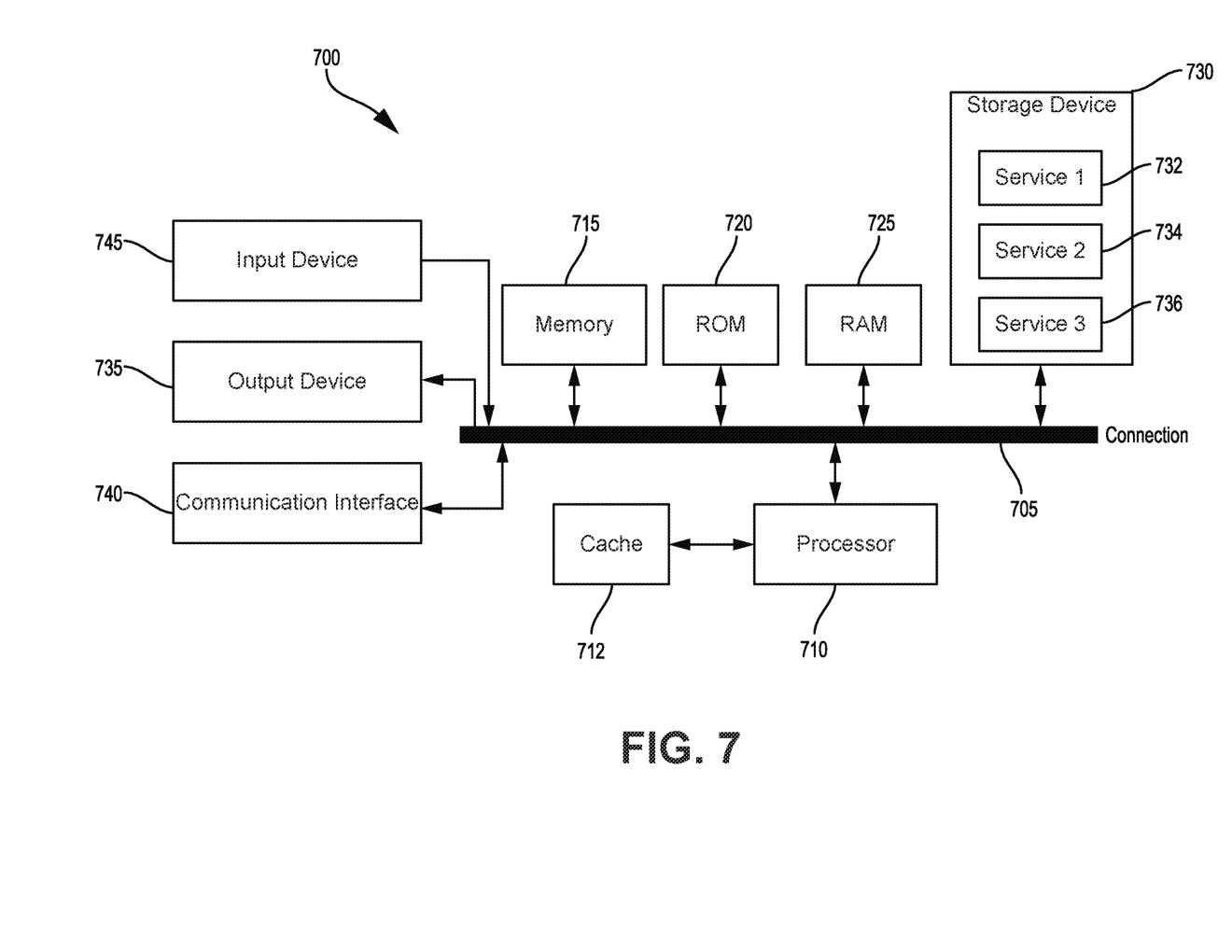
FIG. 7 illustrates an example processor-based system with which some aspects of the subject technology can be implemented, according to some aspects of the present disclosure.

FIG. 7 illustrates an example processor-based system with which some aspects of the subject technology can be implemented. For example, processor-based system 700 can be any computing device making up, or any component thereof in which the components of the system are in communication with each other using connection 705. Connection 705 can be a physical connection via a bus, or a direct connection into processor 710, such as in a chipset architecture. Connection 705 can also be a virtual connection, networked connection, or logical connection.

In some examples, computing system 700 is a distributed system in which the functions described in this disclosure can be distributed within a datacenter, multiple data centers, a peer network, etc. In some examples, one or more of the described system components represents many such components each performing some or all of the function for which the component is described. In some aspects, the components can be physical or virtual devices.

Example system 700 includes at least one processing unit (Central Processing Unit (CPU) or processor) 710 and connection 705 that couples various system components including system memory 715, such as Read-Only Memory (ROM) 720 and Random-Access Memory (RAM) 725 to processor 710. Computing system 700 can include a cache of high-speed memory 712 connected directly with, in close proximity to, or integrated as part of processor 710.

Processor 710 can include any general-purpose processor and a hardware service or software service, such as services 732, 734, and 736 stored in storage device 730, configured to control processor 710 as well as a special-purpose processor where software instructions are incorporated into the actual processor design. Processor 710 may essentially be a completely self-contained computing system, containing multiple cores or processors, a bus, memory controller, cache, etc. A multi-core processor may be symmetric or asymmetric.

To enable user interaction, computing system 700 includes an input device 745, which can represent any number of input mechanisms, such as a microphone for speech, a touch-sensitive screen for gesture or graphical input, keyboard, mouse, motion input, speech, etc. Computing system 700 can also include output device 735, which can be one or more of a number of output mechanisms known to those of skill in the art. In some instances, multimodal systems can enable a user to provide multiple types of input/output to communicate with computing system 700. Computing system 700 can include communications interface 740, which can generally govern and manage the user input and system output. The communication interface may perform or facilitate receipt and/or transmission wired or wireless communications via wired and/or wireless transceivers, including those making use of an audio jack/plug, a microphone jack/plug, a Universal Serial Bus (USB) port/plug, an Apple® Lightning® port/plug, an Ethernet port/plug, a fiber optic port/plug, a proprietary wired port/plug, a BLUETOOTH® wireless signal transfer, a BLUETOOTH® low energy (BLE) wireless signal transfer, an IBEACON® wireless signal transfer, a Radio-Frequency Identification (RFID) wireless signal transfer, Near-Field Communications (NFC) wireless signal transfer, Dedicated Short Range Communication (DSRC) wireless signal transfer, 802.11 Wi-Fi® wireless signal transfer, Wireless Local Area Network (WLAN) signal transfer, Visible Light Communication (VLC) signal transfer, Worldwide Interoperability for Microwave Access (WiMAX), Infrared (IR) communication wireless signal transfer, Public Switched Telephone Network (PSTN) signal transfer, Integrated Services Digital Network (ISDN) signal transfer, 3G/4G/5G/LTE cellular data network wireless signal transfer, ad-hoc network signal transfer, radio wave signal transfer, microwave signal transfer, infrared signal transfer, visible light signal transfer signal transfer, ultraviolet light signal transfer, wireless signal transfer along the electromagnetic spectrum, or some combination thereof.

Communications interface 740 may also include one or more Global Navigation Satellite System (GNSS) receivers or transceivers that are used to determine a location of the computing system 700 based on receipt of one or more signals from one or more satellites associated with one or more GNSS systems. GNSS systems include, but are not limited to, the US-based Global Positioning System (GPS), the Russia-based Global Navigation Satellite System (GLONASS), the China-based BeiDou Navigation Satellite System (BDS), and the Europe-based Galileo GNSS. There is no restriction on operating on any particular hardware arrangement, and therefore the basic features here may easily be substituted for improved hardware or firmware arrangements as they are developed.

Storage device 730 can be a non-volatile and/or non-transitory and/or computer-readable memory device and can be a hard disk or other types of computer readable media which can store data that are accessible by a computer, such as magnetic cassettes, flash memory cards, solid state memory devices, digital versatile disks, cartridges, a floppy disk, a flexible disk, a hard disk, magnetic tape, a magnetic strip/stripe, any other magnetic storage medium, flash memory, memristor memory, any other solid-state memory, a Compact Disc (CD) Read Only Memory (CD-ROM) optical disc, a rewritable CD optical disc, a Digital Video Disk (DVD) optical disc, a Blu-ray Disc (BD) optical disc, a holographic optical disk, another optical medium, a Secure Digital (SD) card, a micro SD (microSD) card, a Memory Stick® card, a smartcard chip, a EMV chip, a Subscriber Identity Module (SIM) card, a mini/micro/nano/pico SIM card, another Integrated Circuit (IC) chip/card, Random-Access Memory (RAM), Atatic RAM (SRAM), Dynamic RAM (DRAM), Read-Only Memory (ROM), Programmable ROM (PROM), Erasable PROM (EPROM), Electrically Erasable PROM (EEPROM), flash EPROM (FLASHEPROM), cache memory (L1/L2/L3/L4/L5/L #), Resistive RAM (RRAM/ReRAM), Phase Change Memory (PCM), Spin Transfer Torque RAM (STT-RAM), another memory chip or cartridge, and/or a combination thereof.

Storage device 730 can include software services, servers, services, etc., that when the code that defines such software is executed by the processor 710, it causes the system 700 to perform a function. In some aspects, a hardware service that performs a particular function can include the software component stored in a computer-readable medium in connection with the necessary hardware components, such as processor 710, connection 705, output device 735, etc., to carry out the function.

Examples and aspects within the scope of the present disclosure may also include tangible and/or non-transitory computer-readable storage media or devices for carrying or having computer-executable instructions or data structures stored thereon. Such tangible computer-readable storage devices can be any available device that can be accessed by a general purpose or special purpose computer, including the functional design of any special purpose processor as described above. By way of example, and not limitation, such tangible computer-readable devices can include RAM, ROM, EEPROM, CD-ROM or other optical disk storage, magnetic disk storage or other magnetic storage devices, or any other device which can be used to carry or store desired program code in the form of computer-executable instructions, data structures, or processor chip design. When information or instructions are provided via a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable storage devices.

Computer-executable instructions include, for example, instructions and data which cause a general-purpose computer, special purpose computer, or special purpose processing device to perform a certain function or group of functions. Computer-executable instructions also include program modules that are executed by computers in stand-alone or network environments. Generally, program modules include routines, programs, components, data structures, objects, and the functions inherent in the design of special-purpose processors, etc. that perform tasks or implement abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Other examples of the disclosure may be practiced in network computing environments with many types of computer system configurations, including personal computers, hand-held devices, multi-processor systems, microprocessor-based or programmable consumer electronics, network Personal Computers (PCs), minicomputers, mainframe computers, and the like. Examples of the disclosure may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices.

The various examples described above are provided by way of illustration only and should not be construed to limit the scope of the disclosure. For example, the principles herein apply equally to optimization as well as general improvements. Various modifications and changes may be made to the principles described herein without following the examples and applications illustrated and described herein, and without departing from the spirit and scope of the disclosure.

Claim language or other language in the disclosure reciting "at least one of" a set and/or "one or more" of a set indicates that one member of the set or multiple members of the set (in any combination) satisfy the claim. For example, claim language reciting "at least one of A and B" or "at least one of A or B" means A, B, or A and B. In another example, claim language reciting "at least one of A, B, and C" or "at least one of A, B, or C" means A, B, C, or A and B, or A and C, or B and C, or A and B and C. The language "at least one of" a set and/or "one or more" of a set does not limit the set to the items listed in the set. For example, claim language reciting "at least one of A and B" or "at least one of A or B" can mean A, B, or A and B, and can additionally include items not listed in the set of A and B.

Illustrative examples of the disclosure include:

Aspect 1. An apparatus comprising: at least one memory; and at least one processor coupled to the at least one memory, the at least one processor configured to: collect, using one or more sensors, a first set of data for a simulation environment; generate, using the first set of data, a point cloud that represents or describes the simulation environment; collect, using the one or more sensors, a second set of data for a real-world environment; generate, using the second set of data and a neural network, a noise model; and generate, using the noise model and the point cloud, a noisy point cloud, wherein the noisy point cloud represents or describes the real-world environment.

Aspect 2. The apparatus of Aspect 1, wherein the one or more sensors includes a Light Detection and Ranging (LiDAR) sensor.

Aspect 3. The apparatus of any of Aspects 1 or 2, wherein the simulation environment comprises at least one of a laboratory, a metaverse, and a virtual environment.

Aspect 4. The apparatus of any of Aspects 1 to 3, wherein the first set of data comprises at least one of a set of intensity values, a set of coordinates, and a set of distances.

Aspect 5. The apparatus of any of Aspects 1 to 4, wherein the point cloud is a three-dimensional representation of the simulation environment.

Aspect 6. The apparatus of any of Aspects 1 to 5, wherein the at least one processor is further configured to: compute, using the second set of data and the noise model, a set of gradients.

Aspect 7. The apparatus of Aspect 6, wherein the at least one processor is further configured to: update, using the set of gradients, a set of weights of the neural network.

Aspect 8. A computer-implemented method comprising: collecting, using one or more sensors, a first set of data for a simulation environment; generating, using the first set of data, a point cloud wherein the point cloud represents or describes the simulation environment; collecting, using the one or more sensors, a second set of data for a real-world environment; generating, using the second set of data and a neural network, a noise model; and generating, using the noise model and the point cloud, a noisy point cloud, wherein the noisy point cloud represents or describes the real-world environment.

Aspect 9. The computer-implemented method of Aspect 8, wherein the one or more sensors includes a Light Detection and Ranging (LiDAR) sensor.

Aspect 10. The computer-implemented method of any of Aspects 8 or 9, wherein the simulation environment comprises at least one of a laboratory, a metaverse, and a virtual environment.

Aspect 11. The computer-implemented method of any of Aspects 8 to 10, wherein the first set of data comprises at least one of a set of intensity values, a set of coordinates, and a set of distances.

Aspect 12. The computer-implemented method of any of Aspects 8 to 11, wherein the point cloud is a three-dimensional representation of the simulation environment.

Aspect 13. The computer-implemented method of any of Aspects 8 to 12, further comprising: computing, using the second set of data and the noise model, a set of gradients.

Aspect 14. The computer-implemented method of Aspect 13, further comprising: updating, using the set of gradients, a set of weights of the neural network.

Aspect 15. A non-transitory computer-readable storage medium comprising instructions which, when executed by one or more processors, cause the one or more processors to: collect, using one or more sensors, a first set of data for a simulation environment; generate, using the first set of data, a point cloud wherein the point cloud represents or describes the simulation environment; collect, using the one or more sensors, a second set of data for a real-world environment; generate, using the second set of data and a neural network, a noise model; and generate, using the noise model and the point cloud, a noisy point cloud, wherein the noisy point cloud represents or describes the real-world environment.

Aspect 16. The non-transitory computer-readable storage medium of Aspect 15, wherein the one or more sensors includes a Light Detection and Ranging (LiDAR) sensor.

Aspect 17. The non-transitory computer-readable storage medium of any of Aspects 15 or 16, wherein the simulation environment comprises at least one of a laboratory, a metaverse, and a virtual environment.

Aspect 18. The non-transitory computer-readable storage medium of any of Aspects 15 to 17, wherein the first set of data comprises at least one of a set of intensity values, a set of coordinates, and a set of distances.

Aspect 19. The non-transitory computer-readable storage medium of any of Aspects 15 to 18, wherein the point cloud is a three-dimensional representation of the simulation environment.

Aspect 20. The non-transitory computer-readable storage medium of any of Aspects 15 to 19, wherein the at least one processor is further configured to: compute, using the second set of data and the noise model, a set of gradients.

Aspect 21. A system comprising means for performing a method according to any of Aspects 8 to 14.

Aspect 22. A computer-program product having stored thereon instructions which, when executed by one or more processors, cause the one or more processors to perform a method according to any of Aspects 8 to 14.

Aspect 23. An autonomous vehicle comprising a computer system configured to perform a method according to any of Aspects 8 to 14.

What is claimed is:

1. An apparatus comprising:
   at least one memory; and
   at least one processor coupled to the at least one memory, the at least one processor configured to:
   collect, using one or more virtual sensors that are operating in a simulation environment, a first set of data that represents the simulation environment, wherein the simulation environment represents virtual objects in a simulated world;
   generate, using the first set of data, a point cloud that represents the simulation environment;
   collect, using one or more real-world sensors, a second set of data that represents a real-world environment, wherein the real-world sensors are physical sensors;
   generate, using the second set of data and a neural network, a noise model that represents noise in the second set of data that prevents the second set of data from accurately representing the real-world environment;
   generate, using the noise model and the point cloud, a noisy point cloud, wherein the noisy point cloud represents or describes the real-world environment;
   passing the noisy point cloud to a discriminator model that indicates whether or not the noisy point cloud was derived from a real-world environment domain; and training the noise model, in response to the discriminator model indicating that the noisy point cloud was not derived from the real-world environment domain, wherein training the noise model includes modifying one or more weights of the noise model.

2. The apparatus of claim 1, wherein the one or more sensors includes a Light Detection and Ranging (LiDAR) sensor.

3. The apparatus of claim 1, wherein the simulation environment comprises at least one of a laboratory, a metaverse, and a virtual environment.

4. The apparatus of claim 1, wherein the first set of data comprises at least one of a set of intensity values, a set of coordinates, and a set of distances.

5. The apparatus of claim 1, wherein the point cloud is a three-dimensional representation of the simulation environment.

6. The apparatus of claim 1, wherein the at least one processor is further configured to:
compute, using the second set of data and the noise model, a set of gradients.

7. The apparatus of claim 6, wherein the at least one processor is further configured to:
update, using the set of gradients, a set of weights of the neural network.

8. A computer-implemented method comprising:
collecting, using one or more virtual sensors that are operating in a simulation environment, a first set of data that represents the simulation environment, wherein the simulation environment represents virtual objects in a simulated world;
generating, using the first set of data, a point cloud wherein the point cloud represents the simulation environment;
collecting, using one or more real-world sensors, a second set of data that represents a real-world environment, wherein the real-world sensors are physical sensors;
generating, using the second set of data and a neural network, a noise model that represents noise in the second set of data that prevents the second set of data from accurately representing the real-world environment;
generating, using the noise model and the point cloud, a noisy point cloud, wherein the noisy point cloud represents or describes the real-world environment;
passing the noisy point cloud to a discriminator model that indicates whether or not the noisy point cloud was derived from a real-world environment domain or was not derived from the real-world environment domain; and
training the noise model, in response to the discriminator model indicating that the noisy point cloud was not derived from the real-world environment domain, wherein training the noise model includes modifying one or more weights of the noise model.

9. The computer-implemented method of claim 8, wherein the one or more sensors includes a Light Detection and Ranging (LiDAR) sensor.

10. The computer-implemented method of claim 8, wherein the simulation environment comprises at least one of a laboratory, a metaverse, and a virtual environment.

11. The computer-implemented method of claim 8, wherein the first set of data comprises at least one of a set of intensity values, a set of coordinates, and a set of distances.

12. The computer-implemented method of claim 8, wherein the point cloud is a three-dimensional representation of the simulation environment.

13. The computer-implemented method of claim 8, further comprising:
computing, using the second set of data and the noise model, a set of gradients.

14. The computer-implemented method of claim 13, further comprising:
updating, using the set of gradients, a set of weights of the neural network.

15. A non-transitory computer-readable storage medium comprising instructions which, when executed by one or more processors, cause the one or more processors to:
collect, using one or more virtual sensors that are operating in a simulation environment, a first set of data that represents the simulation environment, wherein the simulation environment represents virtual objects in a simulated world;
generate, using the first set of data, a point cloud wherein the point cloud represents the simulation environment;
collect, using one or more real-world sensors, a second set of data that represents a real-world environment, wherein the real-world sensors are physical sensors;
generate, using the second set of data and a neural network, a noise model that represents noise in the second set of data that prevents the second set of data from accurately representing the real-world environment;
generate, using the noise model and the point cloud, a noisy point cloud, wherein the noisy point cloud represents or describes the real-world environment;
passing the noisy point cloud to a discriminator model that indicates whether the noisy point cloud was derived from a real-world environment domain or was not derived from a real-world environment domain; and
training the noise model, in response to the discriminator model indicating that the noisy point cloud was not derived from the real-world environment domain, wherein training the noise model includes modifying one or more weights of the noise model.

16. The non-transitory computer-readable storage medium of claim 15, wherein the one or more sensors includes a Light Detection and Ranging (LiDAR) sensor.

17. The non-transitory computer-readable storage medium of claim 15, wherein the simulation environment comprises at least one of a laboratory, a metaverse, and a virtual environment.

18. The non-transitory computer-readable storage medium of claim 15, wherein the first set of data comprises at least one of a set of intensity values, a set of coordinates, and a set of distances.

19. The non-transitory computer-readable storage medium of claim 15, wherein the point cloud is a three-dimensional representation of the simulation environment.

20. The non-transitory computer-readable storage medium of claim 15, wherein the at least one processor is further configured to:
compute, using the second set of data and the noise model, a set of gradients.

* * * * *